United States Patent
Peng et al.

(10) Patent No.: US 10,629,850 B2
(45) Date of Patent: Apr. 21, 2020

(54) FLEXIBLE OLED DISPLAY PANEL AND ENCAPSULATION METHOD THEREOF

(71) Applicant: WUHAN CHINA STAR OPTOELECTRONICS SEMICONDUCTOR DISPLAY TECHNOLOGY CO., LTD., Wuhan, Hubei (CN)

(72) Inventors: Simin Peng, Wuhan (CN); Hsiang lun Hsu, Wuhan (CN); Jun Cao, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/580,216

(22) PCT Filed: Nov. 28, 2017

(86) PCT No.: PCT/CN2017/113334
§ 371 (c)(1),
(2) Date: Dec. 6, 2017

(87) PCT Pub. No.: WO2019/100415
PCT Pub. Date: May 31, 2019

(65) Prior Publication Data
US 2019/0157617 A1    May 23, 2019

(30) Foreign Application Priority Data
Nov. 21, 2017 (CN) .......................... 2017 1 1166817

(51) Int. Cl.
*H01L 51/52* (2006.01)
*H01L 51/00* (2006.01)
*H01L 51/56* (2006.01)

(52) U.S. Cl.
CPC ...... *H01L 51/5259* (2013.01); *H01L 51/0097* (2013.01); *H01L 51/5256* (2013.01); *H01L 51/56* (2013.01); *H01L 2251/5338* (2013.01)

(58) Field of Classification Search
CPC ............. H01L 51/5231; H01L 51/5259; H01L 51/5284
(Continued)

(56) References Cited

U.S. PATENT DOCUMENTS 7,948,176 B2    5/2011 Oh et al.
2004/0251045 A1*    12/2004 Wu ..................... H01L 27/3288
174/250

(Continued)

FOREIGN PATENT DOCUMENTS

CN    105679961 A    6/2016
CN    105810710 A    7/2016
(Continued)

*Primary Examiner* — Long K Tran
(74) *Attorney, Agent, or Firm* — Hauptman Ham, LLP

(57) ABSTRACT

A flexible OLED display panel is disclosed and includes an encapsulation structure. The encapsulation structure includes: a first inorganic thin film formed on a surface of an OLED display layer and a surrounding region of the surface; a first organic thin film formed on a surface of the first inorganic thin film; and a plurality of dams. Each of the dams has a first sub-dam close to the first inorganic thin film and a second sub-dam away from the first inorganic thin film. A gap is formed between the first sub-dam and the second sub-dam which are located at a same side. The gap is filled with desiccant.

10 Claims, 3 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2009/0267487 A1 | 10/2009 | Kwack et al. | |
| 2016/0204373 A1* | 7/2016 | Park | H01L 27/3244 |
| | | | 257/40 |
| 2016/0300888 A1* | 10/2016 | Wang | H01L 27/3213 |
| 2017/0213976 A1 | 7/2017 | Luo et al. | |
| 2018/0226610 A1* | 8/2018 | Moon | H01L 51/5221 |
| 2018/0294435 A1* | 10/2018 | Jin | H01L 51/5253 |

FOREIGN PATENT DOCUMENTS

| | | |
|---|---|---|
| CN | 106816551 A | 6/2017 |
| CN | 106981584 A | 7/2017 |

\* cited by examiner

FLEXIBLE OLED DISPLAY PANEL AND ENCAPSULATION METHOD THEREOF

FIELD OF INVENTION

The present disclosure relates to the technical field of display technology, and more particularly to an OLED display panel and an encapsulation method thereof.

BACKGROUND OF INVENTION

Organic light-emitting diodes (OLED) have broad application prospect because of their advantages of self-illumination, quick response and wide angle of view. The light-emitting material for OLEDs is very sensitive to moisture. The OLED devices will be easily aged if there is permeation of moisture. As a result, the service life of displays will be shortened. In the thin film encapsulation (TFE), organic material with excellent flexibility and inorganic material with good waterproofness are used. By alternately arranging multiple layers of inorganic material and organic material, the permeation path of moisture is lengthened, so that the devices are flexible and also waterproof.

In the TFE encapsulation, a mask is required. Polymers formed by chemical reactions of organic monomers are deposited, via the mask, in an encapsulation region, i.e., an organic layer. However, during the deposition, a portion of the organic layer will be shifted to a set encapsulation region. When the organic layer is shifted to a film plating region of an inorganic layer, the adhesion between the film layers will be decreased, and consequently, this results in the easy permeation of moisture.

In a flexible OLED display panel in the prior art, during the TFE, a problem of decreased adhesion between the layers because of the shifting of the organic layer occurs. This results in the easy permeation of moisture. The service life of OLED devices is thus influenced.

SUMMARY OF INVENTION

In order to solve the technical problem of poor waterproof capability of the encapsulation portion of the OLED display device, the present disclosure provides a flexible OLED display panel in which a path for the permeation of moisture into an OLED display layer can be lengthened.

The present disclosure provides a flexible OLED display panel, comprising:
a flexible substrate;
an OLED display layer formed on a surface of the flexible substrate; and
an encapsulation structure formed on the flexible substrate, covering the OLED display layer and configured to prevent permeation of moisture into the OLED display layer;
wherein the encapsulation structure includes:
a first inorganic thin film formed on a surface of the OLED display layer and a surrounding region of the surface;
a first organic thin film formed on a surface of the first inorganic thin film; and
a plurality of dams arranged on the surface of the flexible substrate and disposed at ends of the first inorganic thin film;
a second inorganic thin film formed on the flexible substrate and covering the first organic thin film and the dam;
a second organic thin film formed on a surface of the second inorganic thin film;
a third inorganic thin film formed on a surface of the second organic thin film;
wherein each of the dams includes a first sub-dam close to the first inorganic thin film and a second sub-dam away from the first inorganic thin film, a gap is formed between the first sub-dam and the second sub-dam which are located at a same end of the first inorganic thin film, and the gap is filled with waterproof material; and
a space is reserved between an edge of the first organic thin film and the first sub-dam to connect the first inorganic thin film and the second inorganic thin film; the space is filled with a first inorganic material layer made of the same material as the first inorganic thin film and the second inorganic thin film.

According to a preferred embodiment of the present disclosure, the flexible OLED display panel further comprises: a third organic thin film formed on a surface of the third inorganic thin film, and a fourth inorganic thin film formed on a surface of the third organic thin film.

According to a preferred embodiment of the present disclosure, a sum of a film thickness of the first organic thin film and a film thickness of the first organic thin film is greater than a height of the dams.

According to a preferred embodiment of the present disclosure, the waterproof material is a cured liquid desiccant or a combination of a cured liquid desiccant and a second inorganic material layer which is made of the same material as the first inorganic material layer.

According to a preferred embodiment of the present disclosure, a top surface of the desiccant is coplanar with a top surface of the dams.

According to a preferred embodiment of the present disclosure, a gap between the first sub-dam and the second sub-dam is filled with the second inorganic material layer having a height less than a height of the first sub-dam and of the second sub-dam, and a liquid desiccant to be cured is formed on a surface of the second inorganic material layer.

The present disclosure further provides another flexible OLED display panel, comprising:
a flexible substrate;
an OLED display layer formed on a surface of the flexible substrate; and
an encapsulation structure formed on the flexible substrate, covering the OLED display layer and configured to prevent permeation of moisture into the OLED display layer;
wherein the encapsulation structure includes:
a first inorganic thin film formed on a surface of the OLED display layer and a surrounding region of the surface;
a first organic thin film formed on a surface of the first inorganic thin film; and
a plurality of dams arranged on the surface of the flexible substrate and disposed at ends of the first inorganic thin film;
a second inorganic thin film formed on the flexible substrate and covering the first organic thin film and the dam;
a second organic thin film formed on a surface of the second inorganic thin film;
a third inorganic thin film formed on a surface of the second organic thin film;
wherein each of the dams includes a first sub-dam close to the first inorganic thin film and a second sub-dam away from the first inorganic thin film, a gap is formed between the first sub-dam and the second sub-dam which are located at a same end of the first inorganic thin film, and the gap is filled with waterproof material.

According to a preferred embodiment of the present disclosure, the flexible OLED display panel further comprises: a third organic thin film formed on a surface of the third inorganic thin film, and a fourth inorganic thin film formed on a surface of the third organic thin film.

According to a preferred embodiment of the present disclosure, a sum of a film thickness of the first organic thin film and a film thickness of the first organic thin film is greater than a height of the dams.

According to a preferred embodiment of the present disclosure, the waterproof material is a cured liquid desiccant or a combination of a cured liquid desiccant and a second inorganic material layer which is made of the same material as the first inorganic material layer.

According to a preferred embodiment of the present disclosure, a top surface of the desiccant is coplanar with a top surface of the dams.

According to a preferred embodiment of the present disclosure, a gap between the first sub-dam and the second sub-dam is filled with the second inorganic material layer having a height less than a height of the first sub-dam and of the second sub-dam, and a liquid desiccant to be cured is formed on a surface of the second inorganic material layer.

The present disclosure further provides an encapsulating method for a flexible OLED display panel. The encapsulating method comprises:
- a step S10 of providing a flexible substrate and forming an OLED display layer on a surface of the flexible substrate;
- a step S20 of providing a plurality of dams on an outer side of the OLED display layer;
- wherein the step S20 further comprises:
  - a step S201 of providing, in a position close to the OLED display layer, a plurality of first sub-dams around the OLED display layer;
  - a step S202 of providing, in a position away from the OLED display layer, a plurality of second sub-dams around the first sub-dams, so that a gap is formed between the first sub-dams and the second sub-dams; and
  - a step S203 of filling a liquid desiccant in the gap and curing the liquid desiccant;
- a step S30 of forming a first inorganic thin film within the first sub-dams so that the first inorganic thin film covers the OLED display layer;
- a step S40 of forming a first organic thin film on a surface of the first inorganic thin film;
- a step S50 of forming a second inorganic thin film on a surface of the substrate so that the second inorganic thin film covers both the dams and the first organic thin film;
- a step S60 of forming a second organic thin film on a surface of the second inorganic thin film; and
- a step S70 of forming a third inorganic thin film on a surface of the second organic thin film.

According to a preferred embodiment of the present disclosure, the step S203 comprises: filling, in the gap, an inorganic material layer having a height less than a height of the first sub-dams and of the second sub-dams, and then forming the liquid desiccant on a surface of the inorganic material layer.

According to a preferred embodiment of the present disclosure, the liquid desiccant is formed in the gap by an ink-jet process or by slot-die coating.

The present disclosure has the following beneficial effects: compared with an existing flexible OLED display panel, in the encapsulation structure for the OLED display panel according to the present disclosure, a plurality of first sub-dams are provided on an outer side of the OLED display layer, a plurality of second sub-dams are provided on an outer side of the first sub-dams, and a desiccant is filled in a gap between the first sub-dams and the second sub-dams, so that the path for permeation of moisture into the OLED display layer is lengthened and the OLED display layer is protected against permeation of moisture. The present disclosure solves the defects of the flexible OLED display panels in the prior art that the permeation of moisture into organic layers is easily caused and the service life of OLED devices is thus influenced, because a block component of the display device positioned near an edge of the display device is close to outside environment and is in contact with organic layers, and the block component is not waterproof.

DESCRIPTION OF DRAWINGS

In order to explain the technical solutions in the present embodiments or in the prior art more clearly, accompanying drawings required in the description of the present embodiments or prior art will be briefly described. Obviously, accompanying drawings are just some embodiments of the present disclosure, while other drawings may be obtained by those skilled in the art according to these drawings, without making any creative effort.

DETAILED DESCRIPTION OF THE PREFERRED EMBODIMENTS

Figure 1:
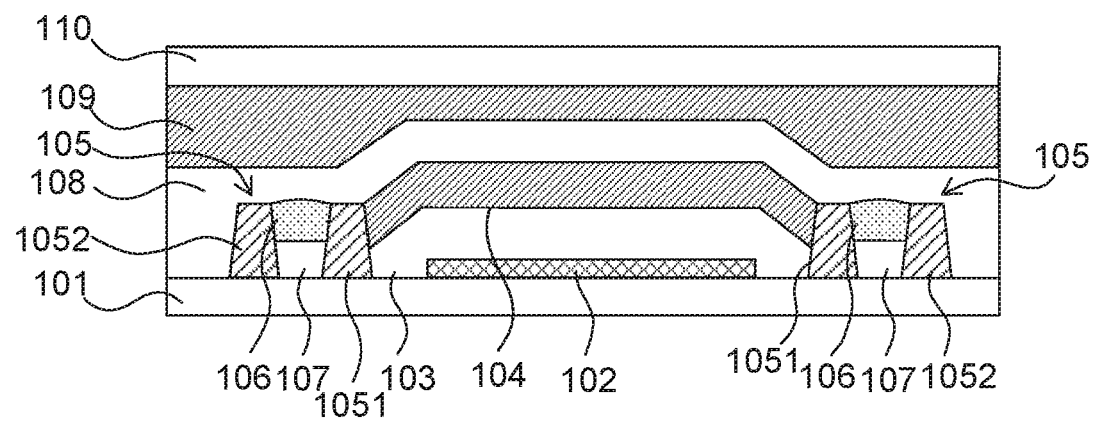
FIG. 1 is a structure diagram of a flexible OLED display panel according to the present disclosure.

Following description of each embodiment is referring to the accompanying drawings so as to illustrate practicable specific embodiments in accordance with the present disclosure. The directional terms described in the present disclosure, such as upper, lower, front, rear, left, right, inner, outer, side and etc., are only directions referring to the accompanying drawings. Thus, the used directional terms are used to describe and understand the present disclosure, but the present disclosure is not limited thereto. In the drawings, similar structural units are designated by the same reference numerals.

The present disclosure is provided based on the fact that in a conventional flexible OLED display panel according to the prior art, a blocking component mounted near an edge of a display device is close to outside environment and is in contact with the organic layers, however, the blocking component is not waterproof, therefore permeation of moisture into organic layers is easily caused and the service life of OLED devices is thus influenced. The embodiments of the present disclosure are capable of solving the defects.

As shown in FIG. 1, a flexible OLED display panel in the present disclosure comprises a flexible substrate 101, an OLED display layer 102 formed on a surface of the flexible substrate 101, and an encapsulation structure formed on the flexible substrate 101, covering the OLED display layer 102 and being configured to prevent permeation of moisture into the OLED display layer 102.

The encapsulation structure comprises: a first inorganic thin film 103 formed on a surface of the BLED display layer 102 and a surrounding region of the surface; a first organic thin film 104 formed on a surface of the first inorganic thin film 103; and a plurality of dams 105.

Each of the dams 105 is arranged on the surface of the flexible substrate 101 and disposed on at least one side opposite to the first inorganic thin film 103. The dams 105 may also be disposed around the first inorganic thin film 103. During forming the first inorganic thin film 103, the dams 105 are configured to define a region for the arrangement of the first inorganic thin film 103.

Each of the dams 105 comprises a first sub-dam 1051 close to the first inorganic thin film 103 and a second sub-dam 1052 away from the first inorganic thin film 103. The second sub-dam 1052 is close to an edge of the flexible substrate 101. A gap is formed between the first sub-dam 1051 and the second sub-dam 1052, and the gap is filled with a desiccant 106. The distance between the first sub-dam 1051 and the second sub-dam 1052 lengthens the path for the permeation of moisture. Moisture will be absorbed by the desiccant 106 when passing through the gap. Thus, the OLED display layer 102 is protected.

During the coating of the liquid desiccant 106, a top surface of the liquid desiccant 106 is brought to be coplanar with a top surface of the dams 105, in order to avoid overflow of the liquid desiccant 106.

For example, before the coating of the liquid desiccant 106, second inorganic material 107 having a height that is ½ of the height of the dams 105 is first applied on a bottom of the gap, the second inorganic material 107 and the first inorganic thin film are formed simultaneously; and then the liquid desiccant 106 is coated on a surface of the second inorganic material 107. In this way, the adhesion between the liquid desiccant 106 and the first sub-dam 1051 and the second sub-dam 1052 can be enhanced, and meanwhile a waterproof composite layer is formed to enhance waterproofing.

In this embodiment, the desiccant 106 is a liquid desiccant. The desiccant 106 is coated in the gap between the first sub-dam 1051 and the second sub-dam 1052 by injection, After the coating of the desiccant 106, the desiccant 106 is cured by UV curing. The desiccant 106 after cured can be flexible while ensuring low moisture permeability. Furthermore, the desiccant 106 after cured has a light transmittance of 95%. Compared with manually or mechanically attaching a solid desiccant, using injection to coat a liquid desiccant onto the flexible substrate is much easier.

A second inorganic thin film 108 is formed on the flexible substrate 101, and the second inorganic thin film 108 covers the first organic thin film 104 and the dams 105. A second organic thin film 109 is formed on a surface of the second inorganic thin film 108. A third inorganic thin film 110 is formed on a surface of the second organic thin film 109.

A sum of a film thickness of the first inorganic thin film 103 and a film thickness of the first organic thin film 104 is greater than a height of the dams 105, and an edge of the first organic thin film 104 is connected to a side of the first sub-dam 1051.

The second organic thin film 109 has a thickness greater than that of other organic thin films and inorganic thin films, serving as a flat layer to fill a recessed region in the second inorganic thin film 108. The third inorganic thin film 110 serves as a waterproof layer which is an outermost layer of the encapsulation structure.

An inorganic thin film may be deposited on the OLED display layer 102 by PECVD (Plasma Enhanced Chemical Vapor Deposition), ALD (Atom Layer Deposition), PLD (Pulse Laser Deposition) or sputtering. An inorganic thin film may be made of $Al_2O_3$, $TiO_2$, $SiN_x$, $SiCN_x$, and $SiO_x$, which is inorganic functional material for enhancing waterproofing.

An organic thin film may be formed by IJP (Ink-Jet Printing) or PEVCD (Plasma Enhanced Chemical Vapor Deposition). An organic thin film may be made of acryl, HMDSO (hexamethyldisiloxane), polyacrylate, polycarbonate, polystyrene material, which is used for buffering the stress applied to the OLED device during bending or folding.

Figure 2:
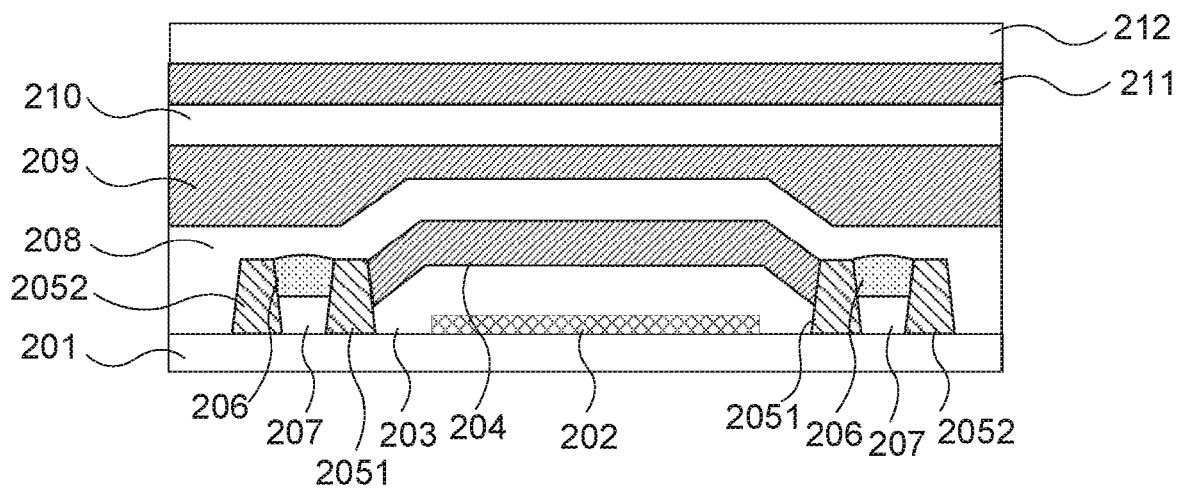
FIG. 2 is another structure diagram of a flexible OLED display panel according to the present disclosure.

As shown in FIG. 2, the flexible OLED display panel according to the present disclosure comprises a flexible substrate 201. An OLED display layer 202, a plurality of first sub-dams 2051 and a plurality of second sub-dams 2052 are formed on a surface of the flexible substrate 201. A desiccant 206 is provided in a gap between the first sub-dams 2051 and the second sub-dams 2052. The first sub-dams 2051 are formed as a frame in which the OLED display layer 202 is located. A first inorganic thin film 203 is also formed in the frame. The first inorganic thin film 203 covers the surface of the OLED display layer 202, and a first organic thin film 204 is formed on the first inorganic thin film 203. A second inorganic thin film 208 is formed on a surface of the first organic thin film 204, a second organic thin film 209 is formed on a surface of the second inorganic thin film 208, and a third inorganic thin film 210 is formed on a surface of the second organic thin film 209.

Second inorganic material 207 having a height that is ½ of that of the dams is applied on the bottom of the gap.

The difference between this solution and the solution described in FIG. 1 lies in that a third organic thin film 211 is formed on a surface of the third inorganic thin film 210 and a fourth inorganic thin film 212 is formed on a surface of the third organic thin film 211.

A layer of organic thin film is additionally provided on a surface of the OLED display panel shown in FIG. 1 to enhance the flexural endurance of the OLED display panel, and finally, the fourth inorganic thin film 212 is formed on the surface of the third organic thin film 211 as an outer waterproof layer of the OLED display panel.

Figure 3:
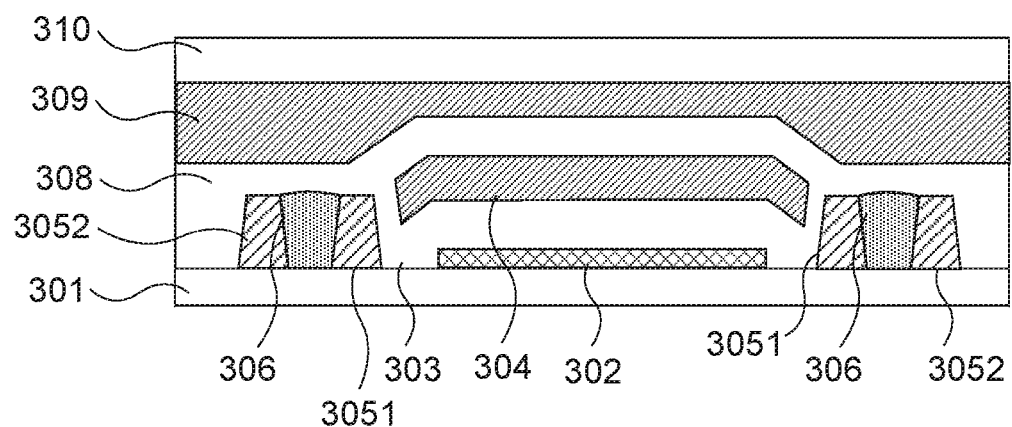
FIG. 3 is still another structure diagram of a flexible OLED display panel according to the present disclosure.

As shown in FIG. 3, the flexible OLED display panel according to the present disclosure comprises a flexible substrate 301. An OLED display layer 302, a plurality of first sub-dams 3051 and a plurality of second sub-dams 3052 are formed on a surface of the flexible substrate 301. A desiccant 306 is provided in a gap between the first sub-dams 3051 and the second sub-dams 3052. The first sub-dams 3051 are formed as a frame in which the OLED display layer 302 is located. A first inorganic thin film 303 is also formed in the frame. The first inorganic thin film 303 covers the surface of the OLED display layer 302, and a first organic thin film 304 is formed on the first inorganic thin film 303. A second inorganic thin film 308 is formed on a surface of the first organic thin film 304, a second organic thin film 309 is formed on a surface of the second inorganic thin film 308, and a third inorganic thin film 310 is formed on a surface of the second organic thin film 309.

The difference between the present solution and the solution described in FIG. 1 lies in that a space is reserved between an edge of the first organic thin film 304 and the first sub-dam 3051 to connect the first inorganic thin film 303 and the second inorganic thin film 308. The space is filled with first inorganic material so that the first organic thin film is covered by the inorganic material, and protection against moisture for the first organic thin film is thus enhanced.

In this solution, the gap between the first sub-dam 3051 and the second sub-dam 3052 is entirely filled with the desiccant 306.

Figure 4:
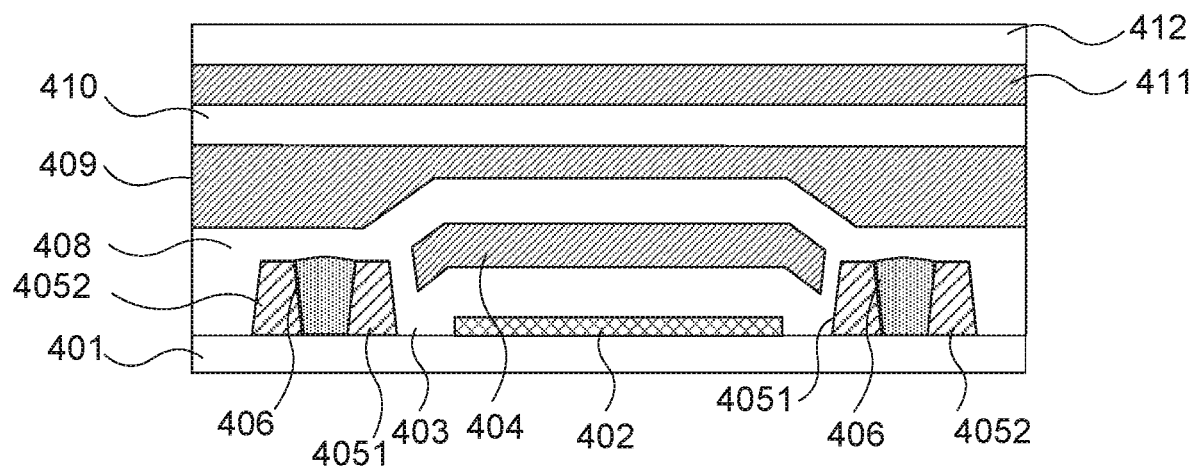
FIG. 4 is yet another structure diagram of a flexible OLED display panel according to the present disclosure.

As shown in FIG. 4, the flexible OLED display panel according to the present disclosure comprises a flexible substrate 401. An OLED display layer 402, a plurality of first sub-dams 4051 and a plurality of second sub-dams 4052 are formed on a surface of the flexible substrate 401. A desiccant 406 is provided in a gap between the first sub-dams 4051 and the second sub-dams 4052. The first sub-dams 4051 are formed as a frame in which the OLED display layer 402 is located. A first inorganic thin film 403 is also formed in the frame. The first inorganic thin film 403 covers the surface of the OLED display layer 402, and a first organic thin film 404 is formed on the first inorganic thin film 403. A second inorganic thin film 408 is formed on a surface of the first organic thin film 404, a second organic thin film 409 is formed on a surface of the second inorganic thin film 408, and a third inorganic thin film 410 is formed on a surface of the second organic thin film 409.

The difference between this solution and the solution described in FIG. 3 lies in that a third organic thin film 411 is formed on a surface of the third inorganic thin film 410 and a fourth inorganic thin film 412 is formed on a surface of the third organic thin film 411. The additional arrangement of the third organic thin film 411 enhances flexural endurance of the OLED display panel, and the additional arrangement of the fourth inorganic thin film 412 enhances waterproofing of the OLED display panel. This will not be repeated here.

Figure 5:
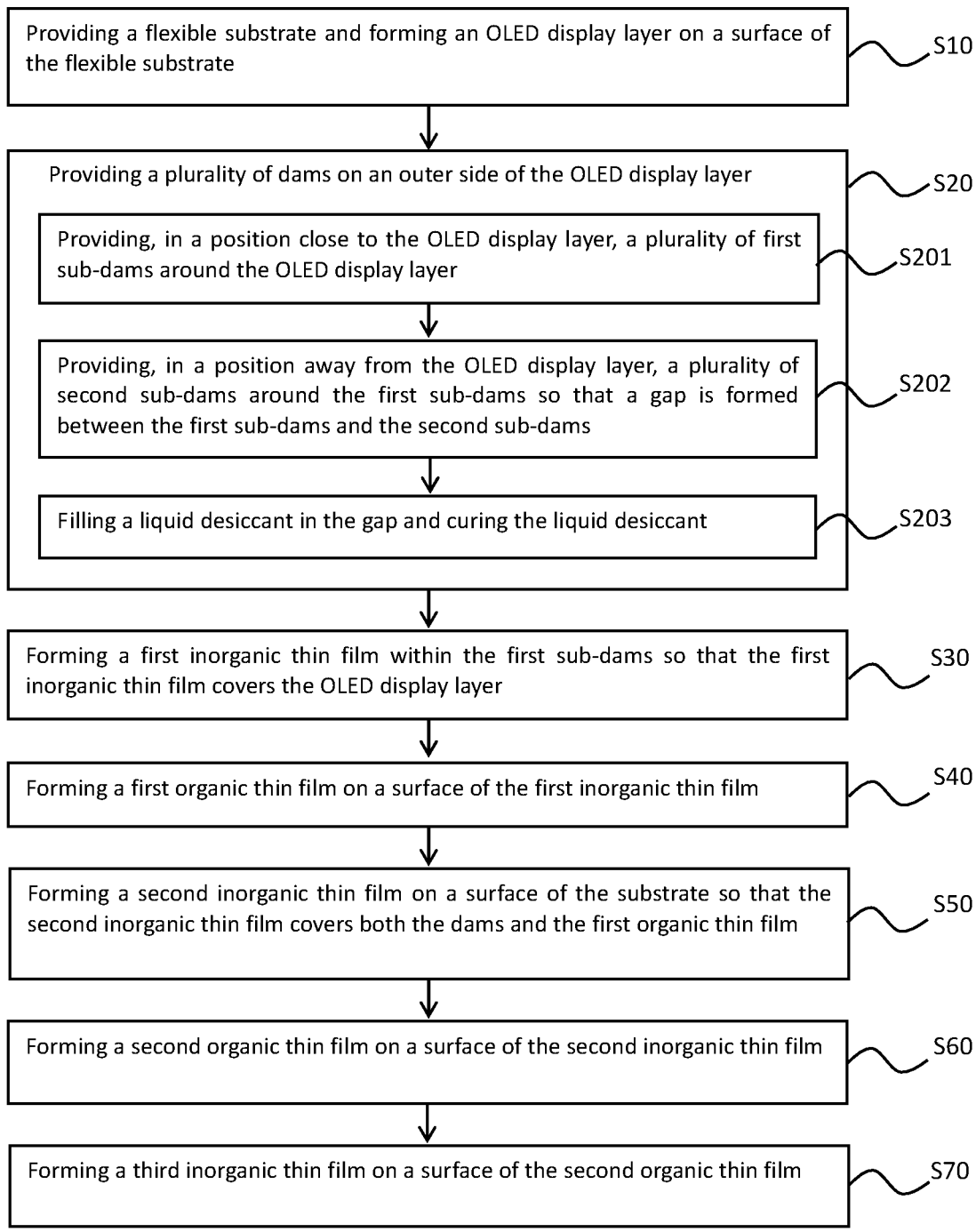
FIG. 5 is a flowchart of an encapsulating method for the flexible OLED display panel according to the present disclosure.

As shown in FIG. 5, according to the objective of the present disclosure, the present disclosure provides an encapsulating method for the flexible OLED display panel, comprising the following steps:

a step S10 of providing a flexible substrate and forming an OLED display layer on a surface of the flexible substrate;

a step S20 of providing a plurality of dams on an outer side of the OLED display layer, wherein the step S20 further comprises: a step S201 of providing, in a position close to the OLED display layer, a plurality of first sub-dams around the OLED display layer; a step S202 of providing, in a position away from the OLED display layer, a plurality of second sub-dams around the first sub-dams so that a gap is formed between the first sub-dams and the second sub-dams; and a step S203 of filling a liquid desiccant in the gap and curing the liquid desiccant;

a step S30 of forming a first inorganic thin film within the first sub-dams so that the first inorganic thin film covers the OLED display layer;

a step S40 of forming a first organic thin film on a surface of the first inorganic thin film;

a step S50 of forming a second inorganic thin film on a surface of the substrate so that the second inorganic thin film covers both the dams and the first organic thin film;

a step S60 of forming a second organic thin film on a surface of the second inorganic thin film; and a step S70 of forming a third inorganic thin film on a surface of the second organic thin film.

The present disclosure has the following beneficial effects: compared with an existing flexible OLED display panel, in the encapsulation structure for the OLED display panel according to the present disclosure, a plurality of first sub-dams are provided on an outer side of the OLED display layer, a plurality of second sub-dams are provided on an outer side of the first sub-dams, and a desiccant is filled in a gap between the first sub-dams and the second sub-dams, so that the path for permeation of moisture into the OLED display layer is lengthened and the OLED display layer is protected against permeation of moisture. The present disclosure solves the defects of the flexible OLED display panels in the prior art that the permeation of moisture into organic layers is easily caused and the service life of OLED devices is thus influenced, because a block component of the display device positioned near an edge of the display device is close to outside environment and is in contact with organic layers, and the block component is not waterproof.

Although the present disclosure has been described with reference to the preferred embodiment thereof, it is apparent to those skilled in the art that a variety of modifications and changes may be made without departing from the scope of the present disclosure which is intended to be defined by the appended claims.

What is claimed is:

1. A flexible OLED display panel, comprising:
    a flexible substrate;
    an OLED display layer formed on a surface of the flexible substrate; and
    an encapsulation structure formed on the flexible substrate, covering the OLED display layer and configured to prevent permeation of moisture into the OLED display layer;
    wherein the encapsulation structure includes:
    a first inorganic thin film formed on a surface of the OLED display layer and a surrounding region of the surface;
    a first organic thin film formed on a surface of the first inorganic thin film; and
    a plurality of dams arranged on the surface of the flexible substrate and disposed at ends of the first inorganic thin film;
    a second inorganic thin film formed on the flexible substrate and covering the first organic thin film and the dams;
    a second organic thin film formed on a surface of the second inorganic thin film;
    a third inorganic thin film formed on a surface of the second organic thin film;
    wherein each of the dams includes a first sub-dam close to the first inorganic thin film and a second sub-dam away from the first inorganic thin film, a gap is formed between the first sub-dam and the second sub-dam which are located at a same end of the first inorganic thin film, and the gap is filled with waterproof material; and
    a space is reserved between an edge of the first organic thin film and the first sub-dam to connect the first inorganic thin film and the second inorganic thin film; the space is filled with a first inorganic material layer made of the same material as the first inorganic thin film and the second inorganic thin film; wherein a sum of a film thickness of the first inorganic thin film and a film thickness of the first organic thin film is greater than a height of the dams.

2. The flexible OLED display panel as claimed in claim 1, wherein the flexible OLED display panel further comprises:

a third organic thin film formed on a surface of the third inorganic thin film, and a fourth inorganic thin film formed on a surface of the third organic thin film.

3. The flexible OLED display panel as claimed in claim 1, wherein the waterproof material is a cured liquid desiccant or a combination of a cured liquid desiccant and a second inorganic material layer which is made of the same material as the first inorganic material layer.

4. The flexible OLED display panel as claimed in claim 3, wherein a top surface of the desiccant is coplanar with a top surface of the dams.

5. The flexible OLED display panel as claimed in claim 4, wherein a gap between the first sub-dam and the second sub-dam is filled with the second inorganic material layer having a height less than a height of the first sub-dam and of the second sub-dam, and a liquid desiccant to be cured is formed on a surface of the second inorganic material layer.

6. A flexible OLED display panel, comprising:
a flexible substrate;
an OLED display layer formed on a surface of the flexible substrate; and
an encapsulation structure formed on the flexible substrate, covering the OLED display layer and configured to prevent permeation of moisture into the OLED display layer;
wherein the encapsulation structure includes:
a first inorganic thin film formed on a surface of the OLED display layer and a surrounding region of the surface;
a first organic thin film formed on a surface of the first inorganic thin film; and
a plurality of dams arranged on the surface of the flexible substrate and disposed at ends of the first inorganic thin film;
a second inorganic thin film formed on the flexible substrate and covering the first organic thin film and the dams;
a second organic thin film formed on a surface of the second inorganic thin film;
a third inorganic thin film formed on a surface of the second organic thin film;
wherein each of the dams includes a first sub-dam close to the first inorganic thin film and a second sub-dam away from the first inorganic thin film, a gap is formed between the first sub-dam and the second sub-dam which are located at a same end of the first inorganic thin film, and the gap is filled with waterproof material; wherein a sum of a film thickness of the first inorganic thin film and a film thickness of the first organic thin film is greater than a height of the dams.

7. The flexible OLED display panel as claimed in claim 6, wherein the flexible OLED display panel further comprises:
a third organic thin film formed on a surface of the third inorganic thin film, and a fourth inorganic thin film formed on a surface of the third organic thin film.

8. The flexible OLED display panel as claimed in claim 6, wherein the waterproof material is a cured liquid desiccant or a combination of a cured liquid desiccant and a second inorganic material layer which is made of the same material as the first inorganic material layer.

9. The flexible OLED display panel as claimed in claim 8, wherein a top surface of the desiccant is coplanar with a top surface of the dams.

10. The flexible OLED display panel as claimed in claim 9, wherein a gap between the first sub-dam and the second sub-dam is filled with the second inorganic material layer having a height less than a height of the first sub-dam and of the second sub-dam, and a liquid desiccant to be cured is formed on a surface of the second inorganic material layer.

* * * * *